US012560647B2

(12) United States Patent     (10) Patent No.:     US 12,560,647 B2

Celis et al.     (45) Date of Patent:     Feb. 24, 2026

(54) CONTACTOR FOR MULTI DEVICE SOCKETS AND RELATED

(71) Applicant: SEMICONDUCTOR COMPONENTS INDUSTRIES, LLC, Scottsdale, AZ (US)

(72) Inventors: Raffy Celis, Carmona (PH); Zan Valde Cagulangan, Santa Rosa (PH)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 343 days.

(21) Appl. No.: 18/315,060

(22) Filed: May 10, 2023

(65) Prior Publication Data

US 2024/0377454 A1     Nov. 14, 2024

(51) Int. Cl.
   *G01R 31/28*     (2006.01)
   *G01R 1/04*     (2006.01)
   *H01L 21/66*     (2006.01)
(52) U.S. Cl.
   CPC ....... *G01R 31/2886* (2013.01); *G01R 1/0466* (2013.01); *G01R 31/2863* (2013.01); *H01L 22/32* (2013.01)
(58) Field of Classification Search
   CPC .............. G01R 1/0466; G01R 1/07314; G01R 31/2879; G01R 31/2886; G01R 31/2889; G01R 31/2896
   See application file for complete search history.

(56) References Cited

U.S. PATENT DOCUMENTS

| | | | | |
|---|---|---|---|---|
| 5,523,695 A * | 6/1996 | Lin | ...................... | G01R 1/0416 |
| | | | | 324/763.01 |
| 7,632,106 B2 * | 12/2009 | Nakamura | ........... | G01R 1/0466 |
| | | | | 439/71 |
| 8,465,312 B2 | 6/2013 | Di Stefano | | |
| 10,734,772 B2 | 8/2020 | Wu | | |

FOREIGN PATENT DOCUMENTS

EP     3527994 A1     8/2019
KR     10-0868452 B1     11/2008

* cited by examiner

*Primary Examiner* — Tung X Nguyen

(74) *Attorney, Agent, or Firm* — Brake Hughes Bellermann LLP

(57) ABSTRACT

A device may include a contactor pad having a first side and a second side. A device may include an opening extending through the contactor pad from the first side to the second side, the opening being configured to receive at least a portion of a socket assembly associated with automated test equipment (ATE) for a semiconductor device. A device may include retaining members disposed on the first side and adjacent to respective edges of the opening, the retaining members being configured to removably secure the socket assembly in the opening.

19 Claims, 14 Drawing Sheets

800

810   Forming a contactor board having a first side and a second side

820   Forming an opening extending through the first side and the second side

830   Disposing retaining clips on the first side and adjacent to an edge of the opening 840   Removably attaching a socket assembly to the contactor board by the retaining clips

CONTACTOR FOR MULTI DEVICE SOCKETS AND RELATED

FIELD

Aspects of this document relate generally to apparatus and methods for semiconductor sockets and testing.

BACKGROUND

Semiconductor fabrication processes involve many steps. One of the steps is testing, which can be conducted at two levels—the wafer test (also called die sort or probe test) that tests wafers, and the package test (also called final test) that is conducted after packaging and prior to the packaged integrated circuits (IC) being incorporated into an electronic apparatus. Semiconductor test equipment, or automated test equipment (ATE), can be used for final testing. The ATE can provide electrical signals to a semiconductor device or packaged IC to compare output signals against expected values to test whether the semiconductor device functions as specified in the design specifications. Contact pins associated with the ATE may be placed in physical and electrical contact with metallized contact surfaces of a packaged IC or a device under test (DUT). These contacts may include test pads, bond pads, solder balls, and/or other conductive media. The functioning of DUTs may be tested by invoking stimuli on various inputs and measuring responses on outputs at the metallized contact surfaces.

SUMMARY

Automated test equipment (ATE) may have its own circuit board, such as a loadboard with one or more arrays of test contacts that are spaced and aligned to make temporary mechanical contact with the contactor pads on the IC. Disclosed are novel devices and methods of a socket assembly that is configured to accept the device under test (DUT) that may be coupled to (e.g., disposed on) the loadboard. The socket assembly may be removably secured in openings formed on the contactor pad. The socket assembly together with the contactor pad may be disposed on the loadboard to form the loadboard assembly. A contact unit holder (CUH) may be placed on the contactor pad assembly to secure the contactor pad to the loadboard and to align the loadboard assembly for insertion into the ATE. The CUH together with the contactor pad assembly and the loadboard may be referred to as the CUH assembly. The CUH may engage with a handler of the ATE during docking of the loadboard with the ATE. The use of a contactor pad may ease the maintenance of the socket assembly and increase tool life.

In some aspects, the techniques described herein relate to a contactor pad assembly including: a contactor pad having a first side and a second side; an opening extending through the contactor pad from the first side to the second side, the opening being configured to receive at least a portion of a socket assembly associated with automated test equipment (ATE) for a semiconductor device; and retaining members disposed on the first side and adjacent to respective edges of the opening, the retaining members being configured to removably secure the socket assembly in the opening.

In some aspects, the techniques described herein relate to a contactor pad assembly, wherein the opening is rectangular in shape and the retaining members are disposed along longer sides of the rectangular opening.

In some aspects, the techniques described herein relate to a contactor pad assembly, further including second openings extending from shorter sides of the rectangular opening, and a length of the second openings being less than a length of the shorter sides.

In some aspects, the techniques described herein relate to a contactor pad assembly, further including the socket assembly being removably attached to the contactor pad by the retaining members.

In some aspects, the techniques described herein relate to a contactor pad assembly, wherein a protrusion of the respective retaining members is inserted into respective engagement features formed on an outer surface of the socket assembly.

In some aspects, the techniques described herein relate to a contactor pad assembly, further including securing mechanisms disposed on the second side, the securing mechanisms being configured to secure the retaining members in a position.

In some aspects, the techniques described herein relate to a contactor pad assembly, wherein the securing mechanisms are tamper-proof and are operated by a socket configured to mate with a head of the securing mechanisms.

In some aspects, the techniques described herein relate to a contactor pad assembly, wherein the socket assembly includes: an alignment plate configured to retain the semiconductor device for testing in the ATE; a socket body removably attached to the contactor pad by the retaining members; and a pin housing including pins configured to extend out of openings formed on a first surface of the pin housing.

In some aspects, the techniques described herein relate to a contactor pad assembly, wherein the socket body includes: a chamber connecting an upper horizontal surface to a lower horizontal surface of the socket body; a ledge formed along inner walls of the chamber, and the ledge dividing the chamber to form an upper chamber and a lower chamber; the alignment plate being disposed in the upper chamber; and the pin housing being disposed in the lower chamber.

In some aspects, the techniques described herein relate to a contactor pad assembly, wherein the alignment plate is disposed on the first side of the contactor pad and the pin housing is disposed on the second side of the contactor pad.

In some aspects, the techniques described herein relate to a contactor pad assembly, wherein the alignment plate includes an aperture configured to expose contact pads of the semiconductor device for testing in the ATE.

In some aspects, the techniques described herein relate to a contactor pad assembly, wherein the pin housing includes a compartment to store the pins configured to contact the contact pads of the semiconductor device.

In some aspects, the techniques described herein relate to a contactor pad assembly, wherein an arrangement of the opening of the pin housing corresponds to an arrangement of the contact pads of the semiconductor device.

In some aspects, the techniques described herein relate to a contactor pad assembly, further including a seal disposed along a periphery of the second side, the seal being configured to seal a connection between the contactor pad assembly and a loadboard.

In some aspects, the techniques described herein relate to a contactor pad assembly, wherein the seal includes a Silicon rubber seal.

In some aspects, the techniques described herein relate to a method of manufacturing a contactor pad assembly, the method including: forming a contactor pad having a first side and a second side; forming an opening extending through the contactor pad from the first side to the second side, the opening being configured to receive a socket assembly associated with automated test equipment (ATE) for a semiconductor device; and disposing retaining members on the first side and adjacent to respective edges of the opening, the retaining members being configured to removably secure the socket assembly in the opening.

In some aspects, the techniques described herein relate to a method, wherein the opening is rectangular in shape and the retaining members are disposed along longer sides of the rectangular opening.

In some aspects, the techniques described herein relate to a method, further including removably attaching the socket assembly to the contactor pad by the retaining members.

In some aspects, the techniques described herein relate to a method, further including disposing securing mechanisms on the second side to secure the retaining members in a fixed position.

In some aspects, the techniques described herein relate to a method, further including forming a seal along a periphery of the second side, the seal being configured to seal a connection between the contactor pad assembly and a loadboard.

The details of one or more implementations are set forth in the accompanying drawings and the description below. Other features will be apparent from the description and drawings, and from the claims.

DETAILED DESCRIPTION

Before a semiconductor device (e.g., a packaged module, a packaged integrated circuit) is used in an electrical device (e.g., a circuit board within a device), the semiconductor device may be tested to ensure that the semiconductor device is operating as per designed functionality. In some implementations, using a defective IC within, for example, a circuit board may hinder the performance of the entire circuit board and/or could cause the entire circuit board to fail or be rejected. In some implementations, it may not be possible or economical to remove a defective semiconductor device from a circuit board after the defective semiconductor device is identified. Thus, testing each semiconductor device can be critical to ensure that every semiconductor device is fully functional before the semiconductor device is used in an electrical device (e.g., a circuit board). A semiconductor device that is being tested by automated test equipment (ATE) can be referred to as a device under test (DUT).

Testing DUTs can be complex for a number of reasons. First, the contacts to the DUTs may not be soldered to the ATE because removing the soldered DUTs after testing may damage the DUTs. Second, the DUTs are relatively small and the contacts within the DUTs can be even smaller and closely spaced. For accurate testing, the ATE contacts can be configured to make reliable and low resistance contact with each of the contacts of the DUTs during the test process (e.g., entire test process), which may extend to even many hours. Failure to make proper contact with each DUT pin (e.g., contact) may result in a failed test even if the DUT is not defective or may erroneously result in a passed test for a bad DUT. Novel devices and methods for improved usage and maintenance of socket assemblies that are disposed on a loadboard for testing a device under test (DUT) are disclosed herein. In particular, a contactor pad that ensures uniform usage of the one or more socket assemblies that are disposed in openings formed in the contactor pad is disclosed. In some examples, the one or more socket assemblies that are disposed on the contactor pad may be tracked by a single identifier of the contractor pad, instead of tracking multiple separate identifiers of socket assemblies that are separately disposed on the loadboard. In addition, having a single identifier to track the one or more socket assemblies ensures that all socket assemblies are serviced in a uniform manner because all the socket assemblies may have been installed in the contactor pad at the same time and may be serviced simultaneously.

Figures 1A, 1B:
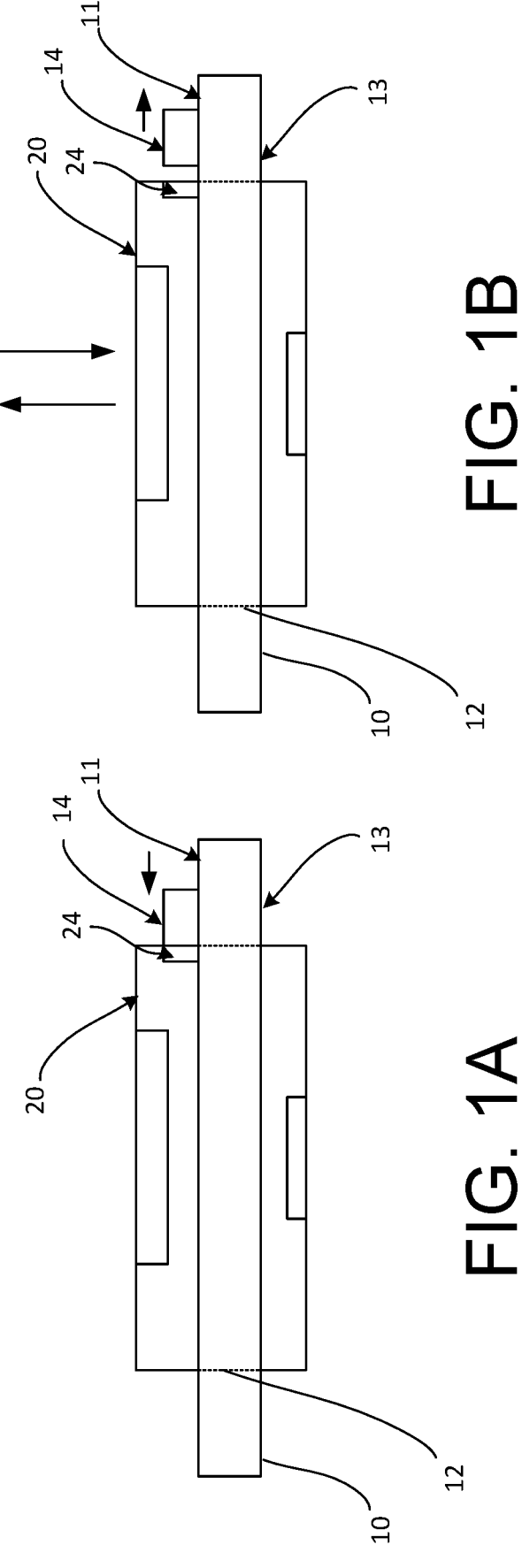
FIGS. 1A and 1B are diagrams illustrating an example of a socket assembly disposed in an opening of a contactor pad.

FIGS. 1A and 1B illustrate an example of a socket assembly 20 disposed in an opening 12 of a contactor pad 10. The socket assembly 20 can be removably coupled to the contactor pad 10. The socket assembly 20 can be removably coupled to the contactor pad 10 via a retaining member 14. As shown in FIGS. 1A and 1B, the retaining member 14 can be coupled to (e.g., movably coupled to) the contactor pad 10.

As shown, the contactor pad 10 has a first side 11 and a second side 13. The opening 12 within the contactor pad 10 may extend from the first side 11 to the second side 13. In some implementations, the socket assembly 20 may have a portion that is disposed above the first side 11 and/or a portion that may be disposed below the second side 13 when the socket assembly 20 is disposed in the opening 12. In some examples, the opening 12 may be configured to receive a socket assembly 20 associated testing a device under test (e.g., semiconductor device) in an ATE.

In some implementations, the socket assembly 20 may not have a portion disposed above the first side 11 when coupled to the contactor pad 10. In some implementations, the socket assembly 20 may not have a portion disposed below the second side 13 when coupled to the contactor pad 10. In some implementations, the socket assembly 20 may have a portion recessed within the opening 12 when coupled to the contactor pad 10. In some implementations, the socket assembly 20 may have a portion recessed within the opening 12 when coupled to the contactor pad 10.

An engagement feature 24 may be disposed on at least one side of the socket assembly 20. The retaining member 14 disposed on the first side 11 of the contactor pad 10 may be configured to engage with the engagement feature 24 to removably secure the socket assembly 20 to the contactor pad 10.

In this implementation, the retaining member 14 is movably coupled to the contactor pad 10. The retaining member 14 can be in a first configuration (e.g., an engaged configuration, a connected configuration, a coupled configuration) where the retaining member 14 is engaged with the engagement feature 24 as shown in FIG. 1A. The retaining member 14 can be in a second configuration where the retaining member 14 is not engaged with (e.g., an unengaged configuration, a disconnected configuration, an uncoupled configuration) the engagement feature 24 as shown in FIG. 1B. The retaining member 14 can be moved between the first configuration and the second configuration. Accordingly, the retaining member 14 can be moved between a configuration coupled with (e.g., in contact with) the engagement feature 24 and uncoupled with (e.g., not in contact with, separated from) the engagement feature 24.

The socket assembly 20 can be removed from the contactor pad 10 and/or moved into the opening 12 of the contactor pad 10 when the retaining member 14 is not engaged with the engagement feature 24 as shown in FIG. 1B. Potential movement of the socket assembly 20 with respect to the contactor pad 10 is represented by the vertical arrows (one pointing up and one pointing down).

As shown in FIGS. 1A and 1B, the retaining member 14 can be moved in a lateral direction with respect to the engagement feature 24 to couple (e.g., fixedly couple) and uncouple the socket assembly 20 to the contactor pad 10. For example, as shown in FIG. 1A, the retaining member 14 can be moved in a lateral direction (shown as an arrow in FIG. 1A) toward the engagement feature 24 when coupling the socket assembly 20 with the contactor pad 10. For example, as shown in FIG. 1B, the retaining member 14 can be moved in a lateral direction (shown as an arrow in FIG. 1A) away from the engagement feature 24 when uncoupling the socket assembly 20 with the contactor pad 10.

As shown in FIGS. 1A and 1B, the direction (e.g., lateral direction) of movement of the retaining member 14 with respect to the engagement feature 24 and the socket assembly 20 is orthogonal to the direction (e.g., vertical direction) of movement of the socket assembly 20 in and out of the contactor pad 10.

Although not shown in FIGS. 1A and 1B, in some implementations, more than one retaining member (similar to retaining member 14) can be included in (or can be part of) the contactor pad 10. In such implementations, more than one engagement feature (similar to engagement feature 24) can be included in (or can be part of) the socket assembly 20.

In some implementations, the engagement feature 24 can be a notch or a recess. In such implementations, the retaining member 14 can include a protrusion, such as a tab, that can be inserted into the engagement feature 24. Accordingly, as illustrated in FIG. 1A, the retaining member 14 can be configured to be inserted into a notch of the engagement feature 24 to secure the socket assembly 20 to the contactor pad 10. Also, as illustrated in FIG. 1B, the protrusion of the retaining member 14 can be moved out of the notch of the engagement feature 24 so that the socket assembly 20 may be removed from the opening 12 of the contactor pad 10.

Although contactor pad 10 is illustrated with one opening 12, in some implementations, the number of openings formed in the contactor pad 10 can be greater than one. For example, the contactor pad 10 can have multiple openings into which one or more socket assemblies (such as socket assembly 20) can be disposed. Accordingly, multiple socket assemblies (such as socket assembly 20) can be removably coupled to the contactor pad 10.

In some implementations, the contactor pad 10, rather than having an opening through the entirety (from the first side 11 to the second side 13) of the contactor pad 10, can have one or more recesses. One or more socket assemblies (such as socket assembly 20) can be coupled to the contactor pad 10 within the one or more recesses. In other words, at least a portion of the socket assembly 20 can be disposed within the recess of the contactor pad 10 and coupled to the contactor pad 10 via the retaining member 14 and the engagement feature 24.

Although not shown in FIGS. 1A and 1B, in some implementations, the retaining member 14 and the engagement feature 24 can be reversed. For example, the engagement feature 24 can be included in the contactor pad 10 and the retaining member 14 can be included in the socket assembly 20.

Figure 2:
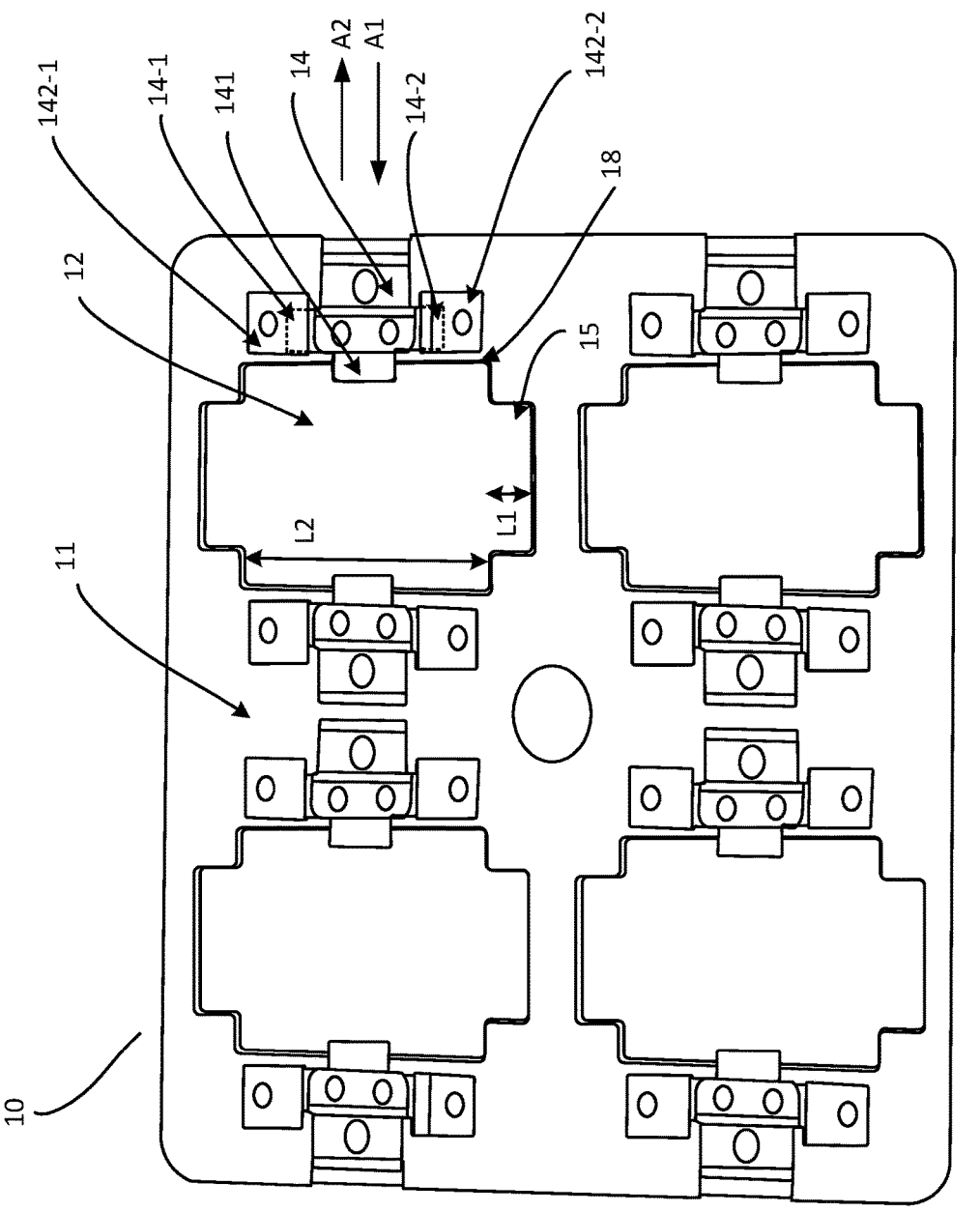
FIG. 2 is a diagram illustrating an example of a first side of the contactor pad illustrated in FIGS. 1A and 1B.
Figures 3A, 3B:
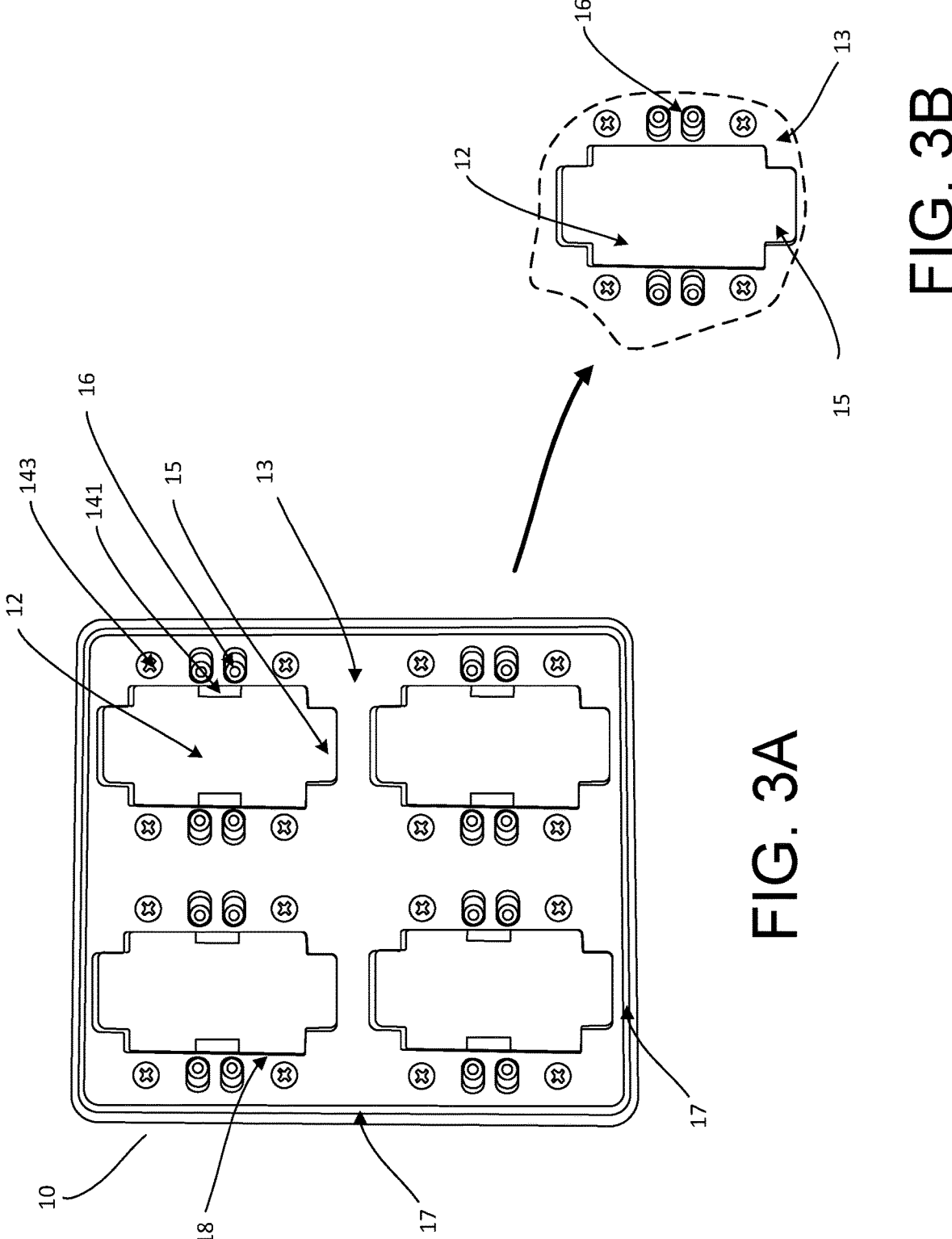
FIGS. 3A and 3B are diagrams illustrating examples of a second side of the contactor pad illustrated in FIGS. 1A through 2.

As shown in FIGS. 2 through 3B, the contactor pad 10 may have a first side 11 and a second side 13. The first side of the contactor pad 10 is illustrated in FIG. 2, and the second side of the contactor pad 10 is illustrated in FIGS. 3A and 3B. In many of the implementations, including in FIGS. 2 through 3B (and other figures in this description), only portions of the contactor pad 10 are described, but many of the elements are duplicated.

One or more opening 12 may be formed on the contactor pad 10, and the opening 12 may extend from the first side 11 to the second side 13. In some examples, the opening 12 may be configured to receive a socket assembly associated with ATE for a semiconductor device, for example DUT 60 (illustrated in FIG. 7H). In some examples, the opening 12 may include an extension 15 extending from two opposing sides of the opening 12. In some examples, a length L1 of the extension 15 may be less than a length L2 of the side of the opening 12 from which the extension 15 extends.

In some examples, the contactor pad 10 may be formed of rubber or silicone rubber. Rubber and silicone rubber are just examples of materials that may be used for the contactor pad 10, and various other materials such as, for example, thermoplastic (TPE), electrical grade epoxy resin (e.g., G10 electrical grade epoxy resin), and other polymer may be used without deviating from the spirit or scope of the illustrated examples.

In an example, the opening 12 may be configured to receive the socket assembly 20. In some examples, the socket assembly 20 may be removably attached to the opening 12 using a fastener, such as a retaining member 14. In an example, the retaining members 14 may be disposed along two opposing sides of the opening 12 on the first side 11 of the contactor pad 10. In some examples, the retaining members 14 may be slidably disposed on first side 11 of the contactor pad 10 using guides 142-1, 142-2.

In this implementation, the retaining member 14 can include portions 14-1 and 14-2 (shown with dashed lines) that slidably move along (e.g., within) the guides 142-1, 142-2. Accordingly, the retaining member 14 can slidably move along (e.g., within or along the guides 142-1, 142-2) the directions A1 and A2 shown in FIG. 2. The retaining member 14 can slidably move along the directions A1 and A2 shown in FIG. 2, to engage and disengage, respectively, with a socket assembly (not shown in FIG. 2).

In some examples, the guides 142-1, 142-2 may be affixed to the first side 11 of the contactor pad 10. In some examples, fasteners 143 (e.g., screw) that are screwed from the second side 13 of the contactor pad 10 may affix the guides 142-1, 142-2 to the contactor pad 10.

In some examples, a protrusion 141 may extend from the retaining members 14, and the protrusion 141 may be configured to be inserted into engagement features 24 formed on opposing sides of the socket assembly 20 (shown in, for example, FIGS. 1A and 1B). As described further with reference to FIG. 4, the protrusion 141 may be configured to removably couple the socket assembly 20 to the opening 12 formed in the contactor pad 10.

In some examples, the opening 12 may be quadrilateral in shape. In some examples, the opening 12 may be rectangular in shape. In some examples, the retaining members 14 may be disposed along the two longer sides of the opening 12 that is rectangular in shape. In some examples, the extension 15 may extend from shorter sides of the rectangular opening 12, and a width of the extension 15 may be less than a width of the shorter sides of the rectangular opening. The shape of the opening 12 may be varied, such as, for example a pentagonal shape, a hexagonal shape, an octagonal shape, or a circular shape, without deviating from the spirit or scope of the illustrated examples.

In some examples, the socket assembly 20 may be inserted into the openings 12 formed in the contactor pad 10. In some examples, after the socket assembly 20 is disposed in the opening 12, the protrusions 141 of the retaining members 14 may be pushed or slid into the engagement features 24 formed on the side of the socket assembly 20.

After the protrusions 141 are slidably moved (along with the retaining member 14) into the engagement features 24, the protrusions 141 may be secured by a securing mechanism (e.g., a screw, a fastener). In some examples, the securing mechanism used to ensure that the protrusions 141 are not displaced out of the engagement features may be tamper-proof screws 16. The tamper-proof screws 16 may be further described with reference to FIGS. 3A, 3B, and 4.

Figure 4:
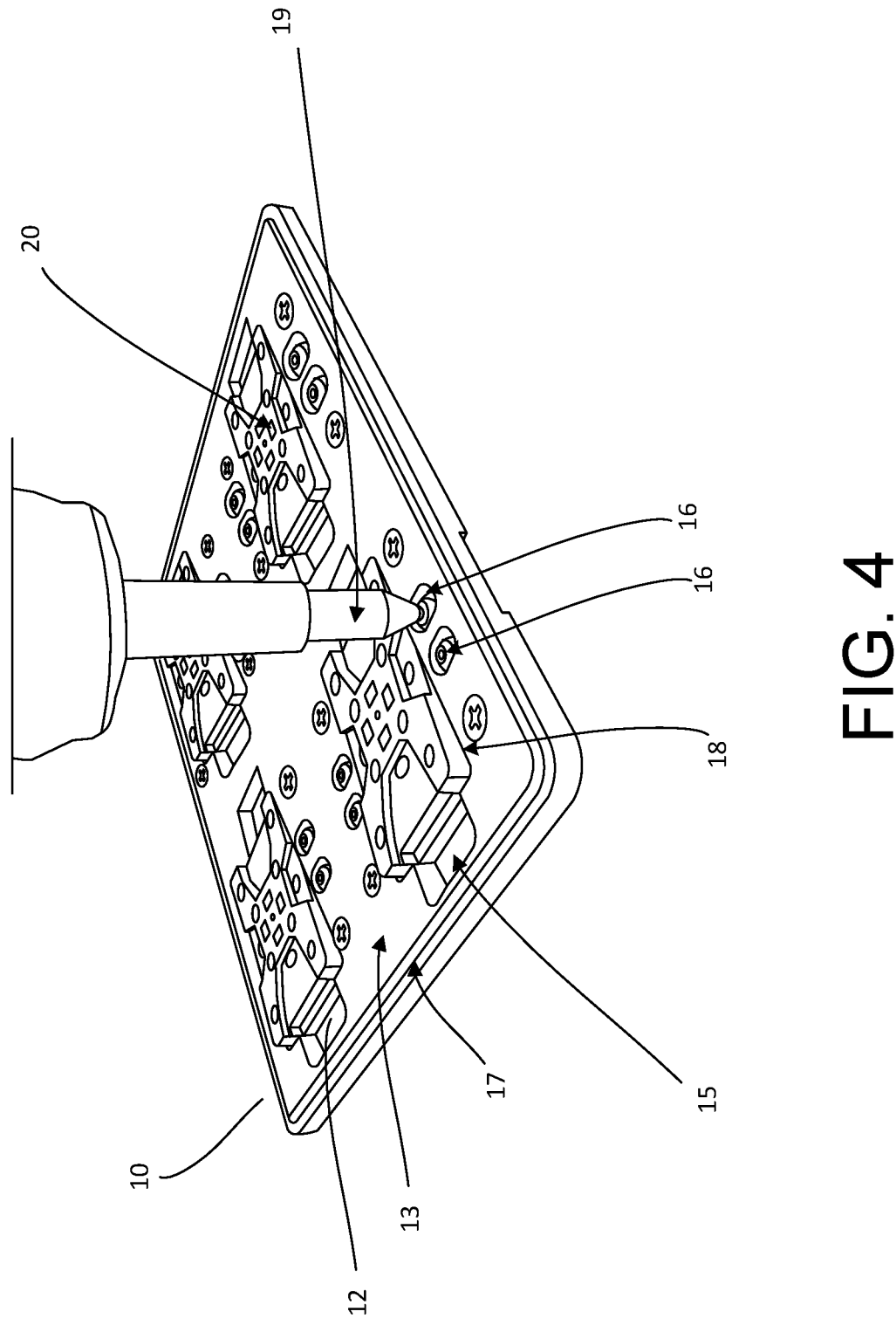
FIG. 4 is a diagram illustrating an example of the contactor pad illustrated in FIGS. 1A through 3B.

As illustrated in FIG. 4, in some examples, the tamper-proof screws 16 may be operated, e.g., loosened or tightened, using a custom socket 19 of a screwdriver that is configured to manipulate the tamper-proof screws 16. In some examples, the custom socket 19 of a screwdriver is configured to mate with the head of the tamper-proof screws. In an example, the socket assembly 20 may be affixed in the openings 12 by tightening the tamper-proof screws 16 to secure (e.g., lock, hold, fixedly hold in a fixed position) the retaining members 14. The socket assembly 20 may be secured to the contactor pad 10 by tamper-proof screws 16 so that it may only be maintained and/or replaced by persons having access to the custom socket 19 for the tamper-proof screws 16. Thus, security and integrity of the testing equipment is improved. In the embodiment illustrated in FIG. 3A, the tamper-proof screws 16 and the protrusion 141 are in a position such that a socket assembly (e.g., the socket assembly 20) may be secured in the openings 12 of the contactor pad 10.

FIG. 3A illustrates an example of the protrusion 141 in a position such that it is inserted into the engagement features 24 formed on the side of the socket assembly 20. FIG. 3A illustrates an opposite side of the contactor pad 10 shown in FIG. 2. In this implementation the protrusion 141 of one of the retaining members 14 is visible.

FIG. 3B illustrates an example of the protrusion 141 in a position when the tamper-proof screws 16 have been loosened and the protrusion 141 may be retracted (e.g., taken out). Accordingly, the protrusion 141 is not visible because it is retracted and is on the side 11 (opposite side 13). In such a configuration, the protrusion 141 may be removed from, for example, an engagement feature formed on the side of the socket assembly. In the embodiment illustrated in FIG.

3B, the tamper-proof screws 16 and the protrusion 141 are in a position such that the socket assembly may be removed from or inserted into the openings 12 of the contactor pad 10.

Figure 5:
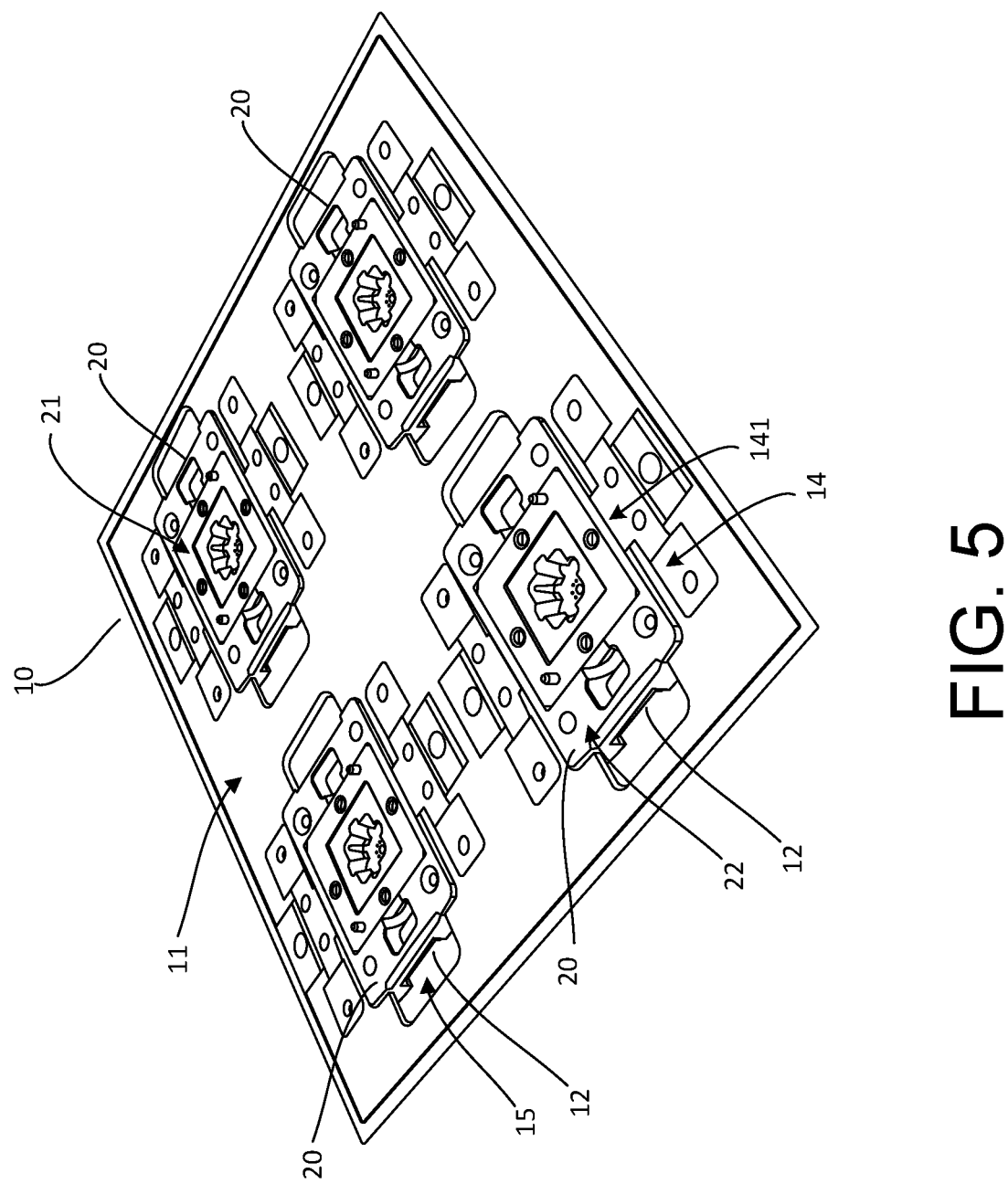
FIG. 5 is a diagram illustrating an example an example of socket assemblies coupled to a contactor pad.

As illustrated in FIG. 5, four socket assembly 20 may be attached to four openings 12 of the contactor pad 10, respectively. The example figures illustrate four openings 12 being formed on the contactor pad 10 and four socket assemblies 20 being disposed in the openings on each of the contactor pad 10. The number of opening 12 on a contactor pad 10, however, may be varied without deviating from the spirit and scope of the illustrative examples described. Based on the number of opening 12 on the contactor pad 10, the number of sockets disposed on the contactor pad 10 may be varied. For example, when the contactor pad 10 has three (3) openings 12, three (3) socket assemblies 20 may be disposed on the contactor pad 10, with one socket assembly 20 being disposed on each of the opening 12. As another example, when the contactor pad 10 has two (2) openings 12, two (2) socket assemblies 20 may be disposed on the contactor pad 10, with one socket assembly 20 being disposed on each of the opening 12. As another example, when the contactor pad 10 has six (6) openings 12, six (6) socket assemblies 20 may be disposed on the contactor pad 10, with one socket assembly 20 being disposed on each of the opening 12. As another example, when the contactor pad 10 has sixteen (16) openings 12, sixteen (16) socket assemblies 20 may be disposed on the contactor pad 10, with one socket assembly 20 being disposed on each of the opening 12. As illustrated in FIG. 5, the socket assembly 20 may be attached to the opening 12 of the contactor pad 10 by the retaining members 14.

As illustrated in FIGS. 3A through 4, in some examples, a seal 17 may be applied towards a peripheral edge of the second side 13 of the contactor pad 10. In some examples, the seal 17 may be a silicone rubber seal. Silicone rubber seals are just an example of the seals 17, and various other seals such as, for example, rubber seals, silicone seals, thermoplastic (TPE) seal, other polymer seals, may be used to ensure sealing and to prevent leaks without deviating from the spirit or scope of the illustrated examples. In some examples, as illustrated in FIGS. 7A through 7H, the seal 17 may seal the interface between CUH 70 and loadboard 40, when mounting the CUH 70 to the loadboard 40. In some examples, the seal 17 may secure the temperature stability during cold (~−40° C.) testing and/or hot (~+125° C.) testing.

Figure 6A:
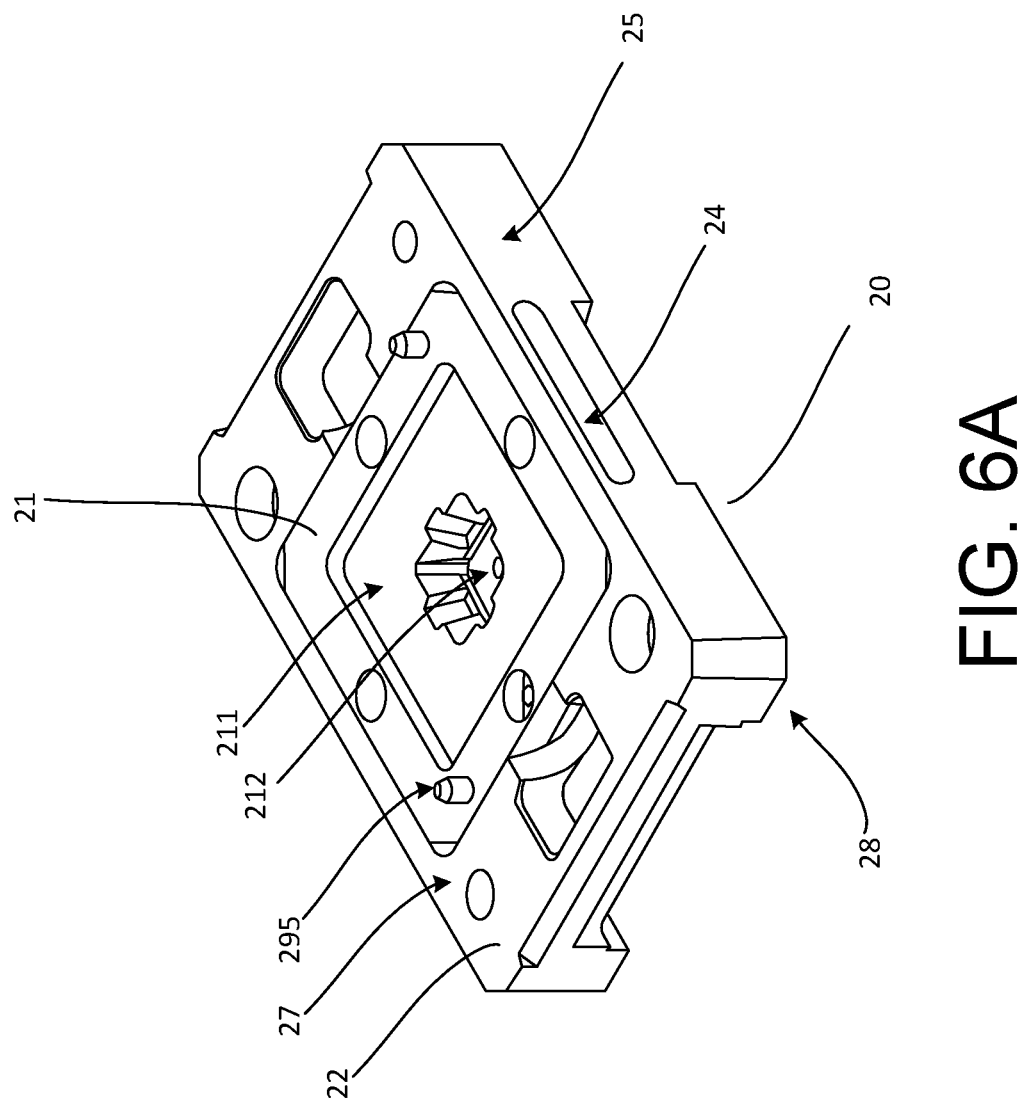
FIG. 6A is a diagram illustrating an example of a socket assembly.

FIG. 6A is a diagram illustrating an example of a socket assembly 20. The socket assembly 20 may include an alignment plate 21, a socket body 22, and a pin housing (not visible in FIG. 6A). A device under test (not shown), such as a module, can be tested via an aperture 212 within a container 211. One or more pins 295 of the socket body 22 may guide the insertion of the alignment plate 21 within the socket assembly 20. Multiple different types of alignment plates (e.g., alignment plate 21), pin housings, and/or containers (e.g., container 211) can be modularly coupled within the socket assembly 20. The combination of these elements can allow for the testing of many types of modules when the socket assembly 20 is used within, for example, a contactor pad as described above. Several examples of socket assemblies and their use with contactor pads are described below.

In some examples, as illustrated in FIGS. 5 and 6A, the socket assembly 20 may include an alignment plate 21, a socket body 22, and a pin housing (not shown). In some examples, the socket assembly 20 may be quadrilateral in shape. In some examples, the socket assembly 20 may be rectangular in shape. The shape of the socket assembly 20 may be varied, such as, for example, a pentagonal shape, a hexagonal shape, an octagonal shape, or a circular shape, without deviating from the spirit or scope of the illustrated examples.

Figures 7A, 7B, 7C:
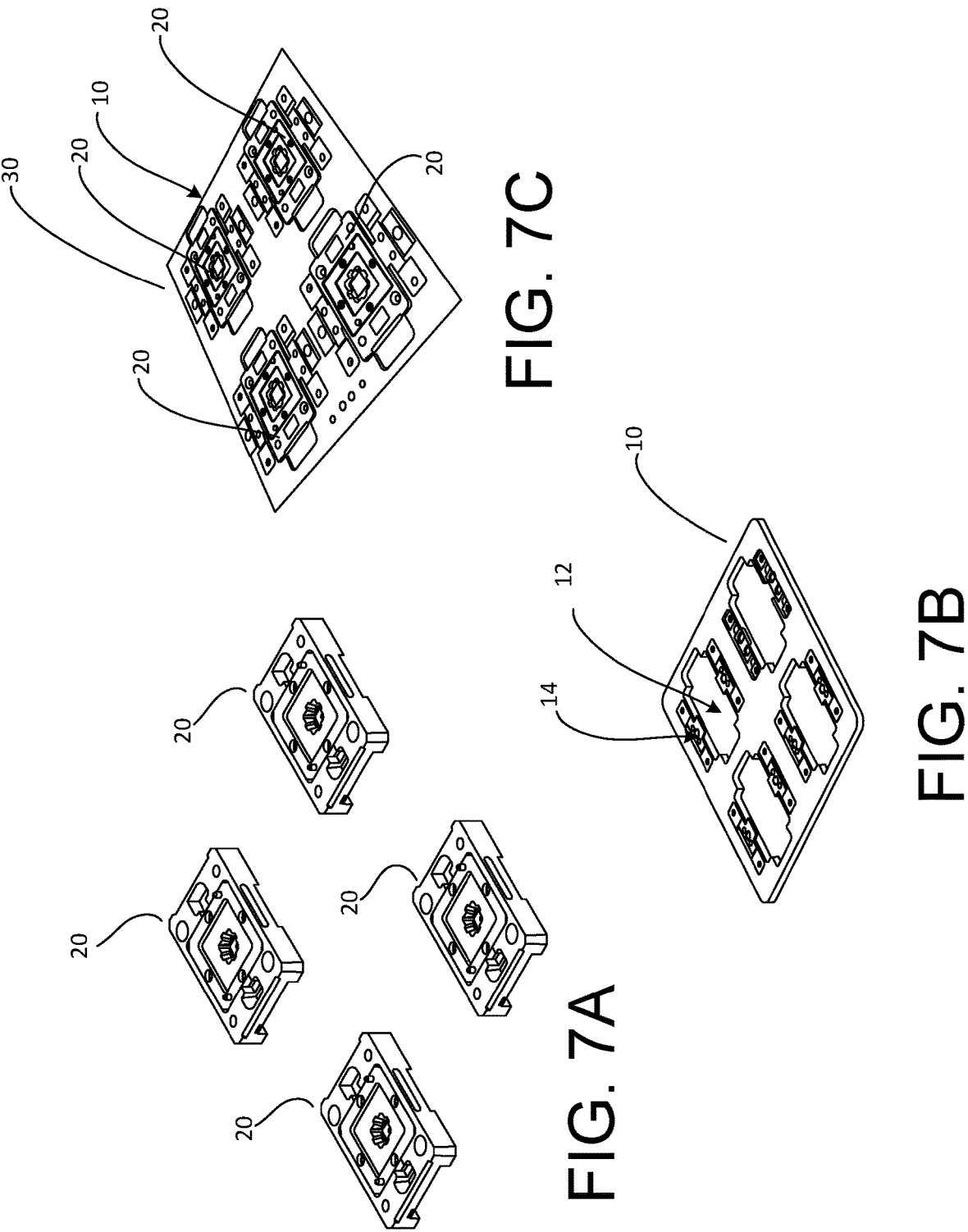
FIGS. 7A through 7H are diagrams illustrating examples of a method of preparing a contact unit holder (CUH) assembly for insertion into an automated test equipment (ATE).

In some examples, as illustrated in FIG. 4, the socket assembly 20 may be configured to be removably attached in the openings 12 of the contactor pad 10. In some examples, as illustrated in FIG. 6A, engagement features 24 may be formed on two opposing vertical outer surface 25 of the socket assembly 20. In some examples, the engagement features 24 may be disposed along the two longer sides of the socket assembly 20 that is rectangular in shape. In some examples, the engagement features 24 may be disposed along approximately a center of a side of the socket assembly 20. In some examples, as illustrated in FIG. 7A, the engagement features 24 may be configured to mate with the retaining members 14 to removably secure the socket assembly 20 to the opening 12 of the contactor pad 10. In some examples, as illustrated in FIG. 7A, the engagement features 24 may be formed on a vertical outer surface 25 of the socket body 22. In some examples, the retaining members 14 may be inserted into engagement features 24 formed on the two opposing vertical outer surfaces 25 of the socket assembly 20. In some examples, the protrusions 141 of the respective retaining members 14 may be inserted into respective engagement features 24 formed on the outer surfaces 25 of the socket assembly 20.

Figure 6B:
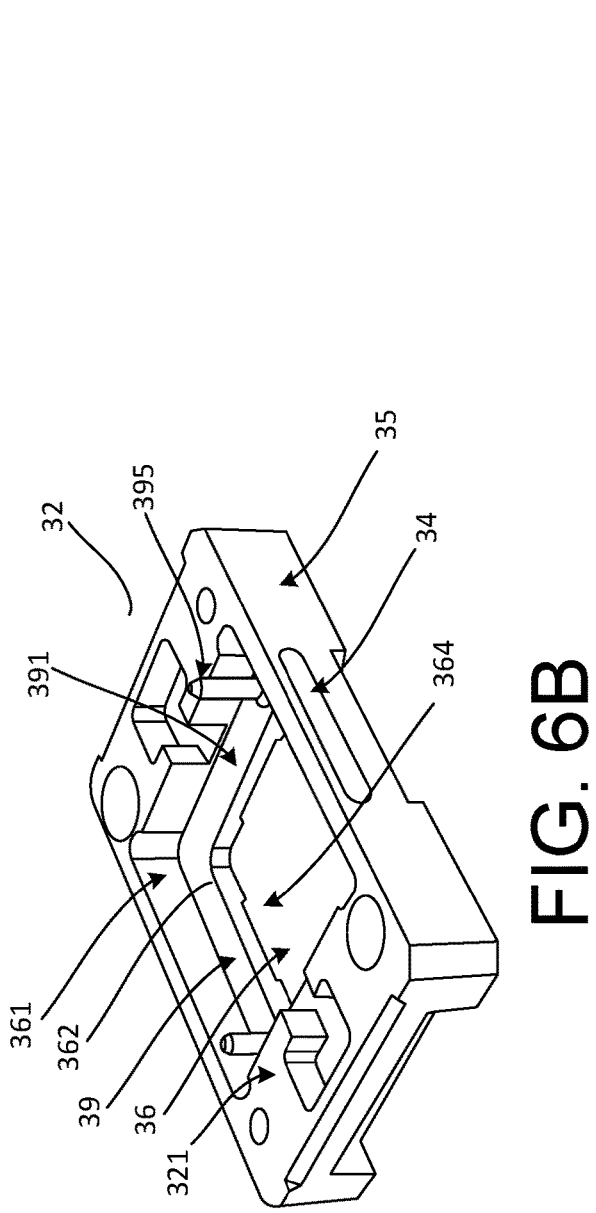
FIGS. 6B through 6G are diagrams illustrating examples of various components associated with a socket assembly.
Figure 6D:
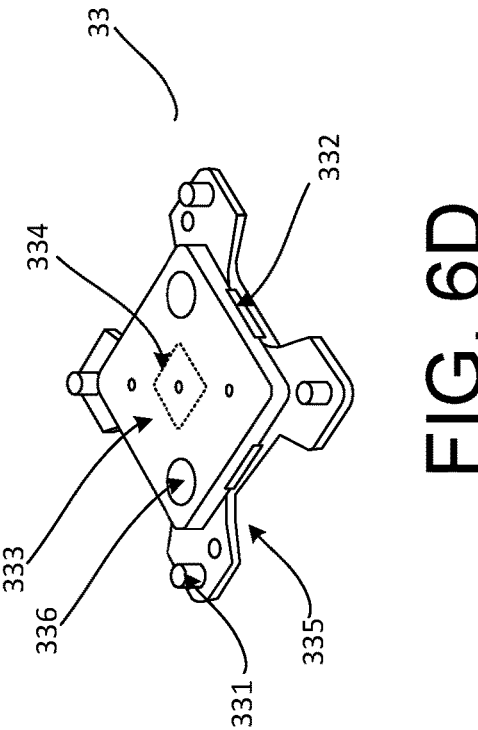
Figure 6C:
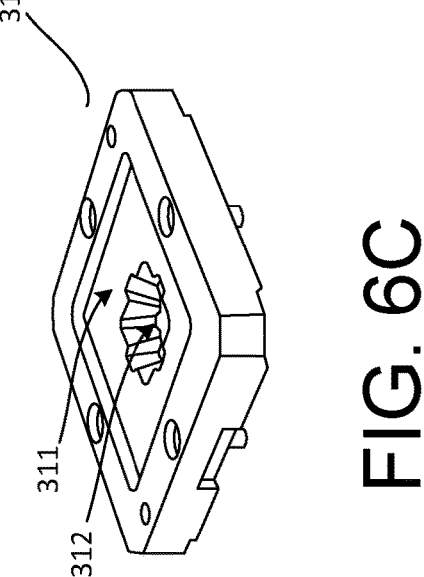
Figure 6G:
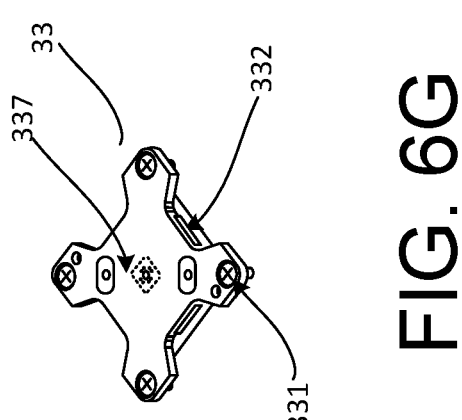
Figure 6E:
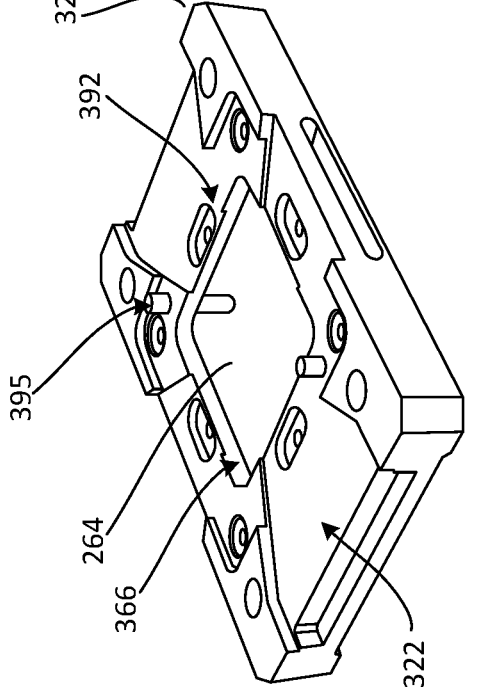
Figure 6F:
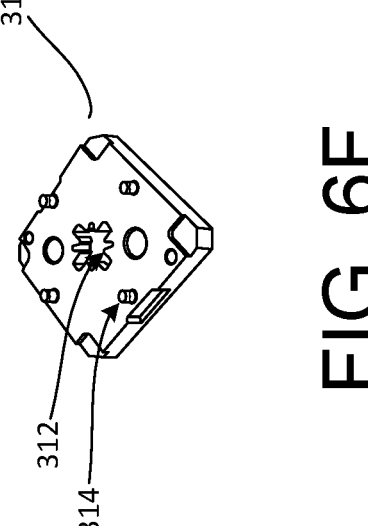

FIGS. 6B through 6G are diagrams illustrating an example of a top view and a bottom view of components of another embodiment of the socket assembly 20. As illustrated in FIGS. 7B through 7G, the socket assembly 20 may include an alignment plate 31, a socket body 32, and a pin housing 33. A top view and a bottom view of the socket body 32 are illustrated in FIGS. 6B and 6E, respectively. A top view and a bottom view of the alignment plate 31 are illustrated in FIGS. 6C and 6F, respectively. A top view and a bottom view of the pin housing 33 are illustrated in FIGS. 6D and 6G, respectively.

As illustrated in FIGS. 6B and 6E, a chamber 36 may be formed on an upper horizontal surface 321 of the socket body 32 of the socket assembly 20. In some examples, the chamber 36 may connect the upper horizontal surface 321 to the lower horizontal surface 322 of the socket body 32 of the socket assembly 20. A ledge 39 may be formed along inner walls 361 of the chamber 36. The ledge may have an upper surface 391 and a lower surface 392. In some examples, the ledge 39 may divide the chamber 36 to form an upper chamber 362 and a lower chamber 364. In some examples, the alignment plate 31 may be disposed in the upper chamber 362. One or more pins 395 may be attached to the ledge 39 to guide the insertion of the alignment plate 31 into the upper chamber 362. The alignment plate 31 may be configured to be seated on the upper surface 391 of the ledge 39 and rest along the inner walls 361 of the upper chamber 362. Fasteners, such as, for example, screws, hooks, bolt, latch may be used to removably secure the alignment plate 31 to the ledge 39 of the socket body 32.

As illustrated in FIGS. 6C and 6F, the alignment plate 31 (e.g., aligner plate) may have a container 311 configured to accommodate and retain the DUT 60 for testing. As illustrated in FIG. 6F, one or more pins 314 may be attached to the bottom of the alignment plate 31. The one or more pins 314 together with the one or more pins 395 of the socket body 32 may guide the insertion of the alignment plate 31 into the upper chamber 362 of the socket body 32. The contact pads on the DUT 60 (illustrated in FIG. 7H) may be exposed through an aperture 312 formed in approximately a center of the alignment plate 31. Various types of DUT, such as, for example, a dual-flat no-leads (DFN) package, a quad flat no-leads (QFN) package, a quad flat (QFP) package, a micro leadframe (MLF) package, a thin quad flat pack (TQFP) package, and/or a Low Profile Quad Flat Pack (LQFP) package may be disposed in the container 311 of the alignment plate 31. In some examples, the sizes of the DUT 60 disposed in the container 311 of the alignment plate 31 may be one or more of 3×3, 4×4, 5×5, 6×6, and/or 7/7 (in mm). The types and sizes of the DUT 60 disposed in the container 311 of the alignment plate 21 are just an example and various other types and sizes of DUT 60 may be used, without deviating from the spirit or scope of the illustrated examples.

As illustrated in FIGS. 6D and 6G, the pin housing 33 may be disposed in the lower chamber 264. The pin housing 33 may have an upper surface 333 and a lower surface 337. One or more pins 331 may be attached to the edges of the pin housing 33 to guide the insertion of the pin housing 33 into the lower chamber 264. In some examples, the one or more pins 331 may be attached to edges of legs 335 extending from the edges of the pin housing 33. In some examples, one or more recess 336 may be formed on an upper surface 333 of the pin housing 33 to mate with the one or more pins 395 of the socket body 32. The one or more pins 331 of the pin housing 33 together with the one or more pins 395 of the socket body 32 may guide the insertion of the pin housing 33 into the lower chamber 264 of the socket body 32. The pin housing 33 may be configured to be seated on the lower surface 392 of the ledge and rest along the inner walls 366 of the lower chamber 264. Fasteners, such as, for example, screws, hooks, bolt, latch may be used to removably secure the pin housing 33 to the ledge 39 of the socket body 32. Pins (not shown), such as, for example, pogo pins may be disposed in a compartment 332 of the pin housing 33. In some examples, the pins may be configured to contact the contact pads of the DUT 60 during testing in the ATE.

The pins disposed in the compartment 332 of the pin housing 33 may be configured to extend out through openings 334 formed on an upper surface 333 of the pin housing 33. In some examples, an arrangement of the opening 334 of the pin housing 33 may correspond to an arrangement of the contact pads of the semiconductor device disposed on the alignment plate 31. The pins may contact the contact pads on the DUT 60 that is disposed in the container 311 of the alignment plate 31. The alignment plate 31 of the socket assembly 20 may align the DUT 60 in the socket assembly 20 so that the pins are aligned with the contact pads on the DUT 60.

As we move from one package size to another for testing of the DUT 60, the whole socket assembly 20 may not need to be replaced. For example, when the DUT 60 is changed from 24QFN 4×4 package to a 32 QFP 7×7 package, we may replace the alignment plate 31 and the pin housing 33 only and we may not need to replace the whole socket assembly 20.

Figure 6H:
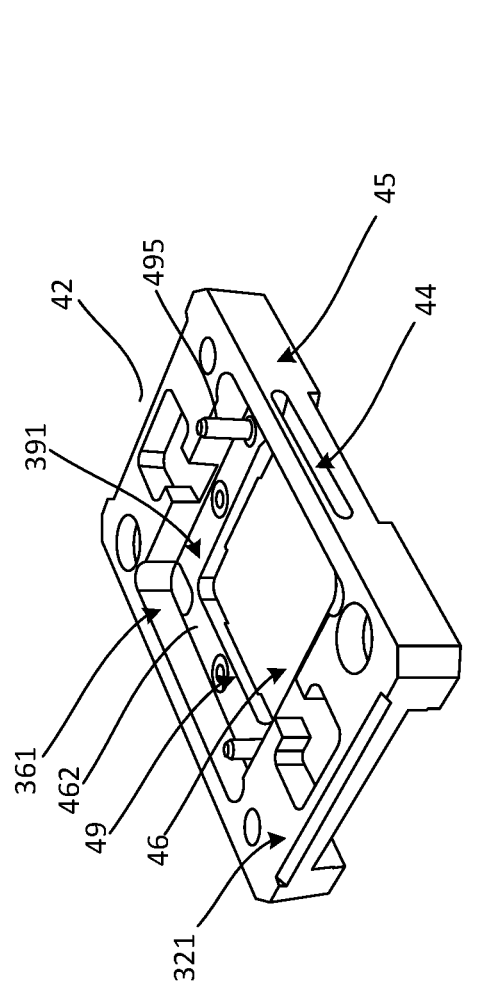
FIGS. 6H through 6M are diagrams illustrating additional examples of various components associated with a socket assembly.
Figure 6J:
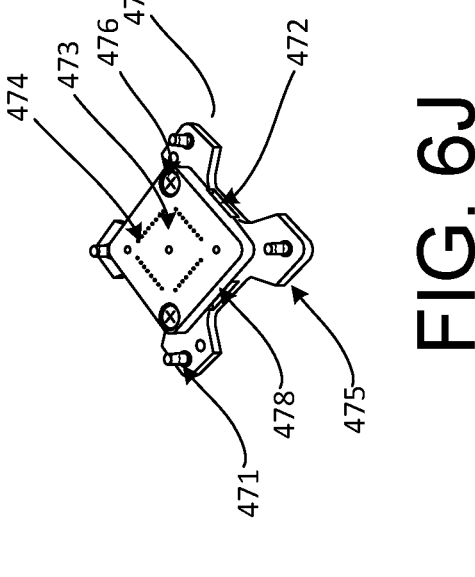
Figure 6I:
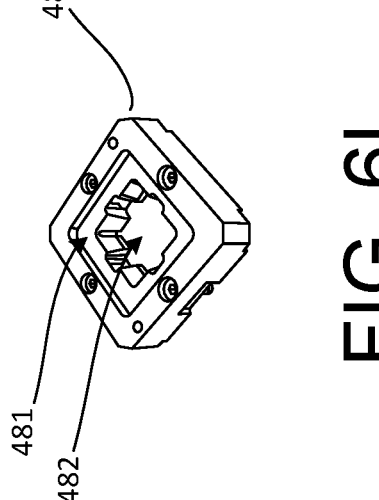
Figure 6M:
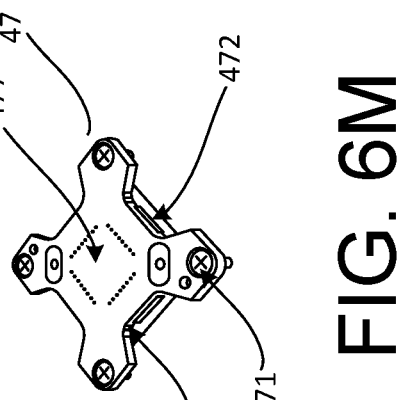
Figure 6K:
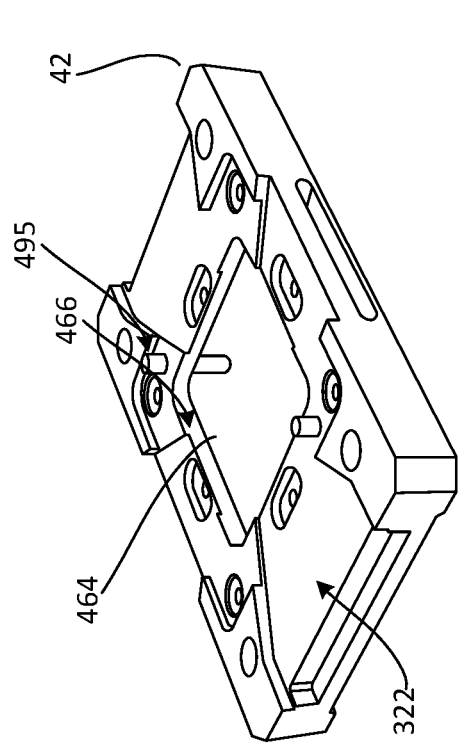
Figure 6L:
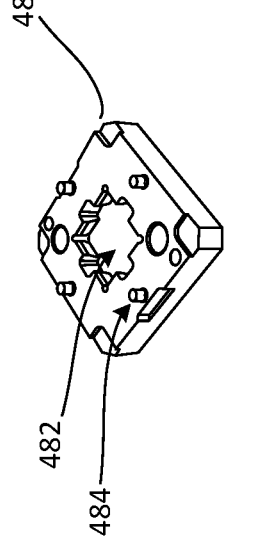

FIGS. 6H through 6M are diagrams illustrating another example of a top view and a bottom view of socket assembly 20. As illustrated in FIGS. 6H through 6M, the socket assembly 20 may include an alignment plate 48, a socket body 42, and a pin housing 47. A top view and a bottom view of the socket body 42 are illustrated in FIGS. 6H and 6K, respectively. The socket body 32 illustrated in FIGS. 6B and 6E is similar to the socket body 42 illustrated in FIGS. 6H and 6K, thus these descriptions of socket body 32 from FIGS. 6B and 6E are incorporated herein by reference, and may not be repeated for brevity. A top view and a bottom view of the alignment plate 48 are illustrated in FIGS. 6I and 6L, respectively. A top view and a bottom view of the pin housing 47 are illustrated in FIGS. 6J and 6M, respectively.

As illustrated in FIGS. 6I and 6L, the alignment plate 48 may have a container 481 configured to accommodate and retain the DUT 60. In the example illustrated in FIGS. 6I and 6L, the DUT 60 may be different from the DUT 60 used with the alignment plate 31. For example, 32 QFP 7×7 package may be used for testing with alignment plate 48, while 24QFN 4×4 package may be used for testing with alignment plate 31. As illustrated in FIG. 6L, one or more pins 484 may be attached to the bottom of the alignment plate 48. The one or more pins 484 together with the one or more pins 495 of the socket body 42 may guide the insertion of the alignment plate 48 into the upper chamber 462 of the socket body 42. The contact pads on the DUT 60 may be exposed through the opening 482 formed in approximately a center of the alignment plate 48.

As illustrated in FIGS. 6J and 6M, the pin housing 47 may be disposed in the lower chamber 464 of the socket body 42. The pin housing 47 may have an upper surface 473 and a lower surface 477. One or more pins 471 may be attached to the edges of the pin housing 47 to guide the insertion of the pin housing 47 into the lower chamber 464. In some examples, the one or more pins 471 may be attached to edges of legs 475 extending from the edges of the pin housing 47. The pin housing 47 may be configured to be seated on the lower surface of the ledge of the socket body 42 and rest along the inner walls 466 of the lower chamber 464. Fasteners, such as, for example, screws, hooks, bolt, latch may be used to removably secure the pin housing 47 to the ledge 49 of the socket body 42. Pins (not shown), such as, for example, pogo pins may be disposed or stored in a compartment 472 of the pin housing 47. The compartment 472 may be formed of a first member 478 having the upper surface 473 as an outer surface and a second member 479 having the lower surface 477 as an outer surface. The first member and the second member may be secured to each other with one or more fasteners 476 to form the compartment 472. In some examples, the compartment 472 may be opened to repair/maintain the pins by unfastening (e.g., unlocking) the one or more fasteners 476.

The pins disposed in the compartment 472 of the pin housing 47 may be configured to extend out through openings 474 formed on the upper surface 473 of the pin housing 47. The pins may contact the contact pads on the DUT 60 that is disposed in the container 481 of the alignment plate 48 (or 31). The alignment plate 48 (or 31) of the socket assembly 20 may align the DUT 60 in the socket assembly 20 so that the pins are aligned with the contact pads on the DUT 60.

As per the devices and methods described herein, when moving from one package to another package for testing of the DUT 60, the complete socket assembly 20 may not need to be replaced, only the alignment plate 31 or 48 and the pin housing 33 or 47 may be switched. In addition, when designing testing solutions for a new package, the design time and costs may also be reduced because only the alignment plate 31 or 48 and the pin housing 33 or 47 may need to be designed and the whole socket may not need to be redesigned.

The down time for replacing and/or maintaining each socket assembly 20 individually may contribute significantly to the upkeep and maintenance of the automated test equipment (ATE). In the embodiments disclosed above, the down time for the ATE may be reduced since all the socket assemblies 20 on the contactor pad 10 may be maintained and/or serviced at one time. Since the one or more socket assemblies 20 are tracked and serviced uniformly, the socket pins may also be serviced and/or replaced uniformly, thereby avoiding premature pin replacement and unnecessary repair and/or maintenance expenses.

An ATE may have its own circuit board, such as a loadboard 40 with one or more arrays of test contacts that are spaced and aligned to make temporary mechanical contact with the contact pads on the IC. As shown in FIGS. 7A through 7H, a socket assembly 20 that is configured to accept the device under test (DUT) 60 may be disposed on the loadboard 40. The socket assembly 20 may be removably secured in openings 12 formed on the contactor pad 10.

Figures 7D, 7E:
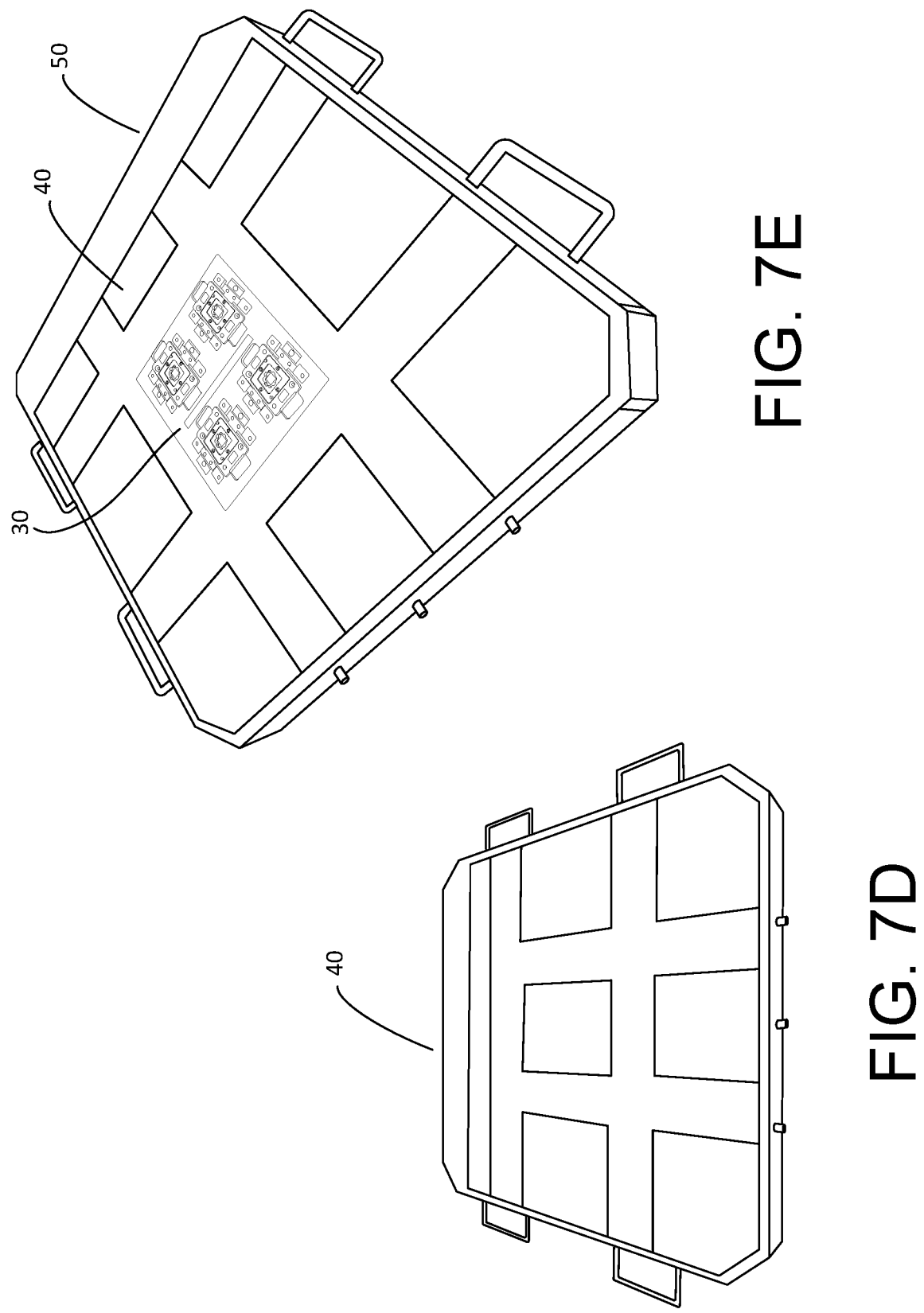
Figure 7H:
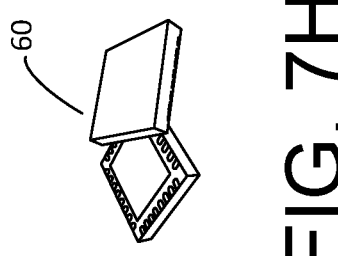
Figure 7G:
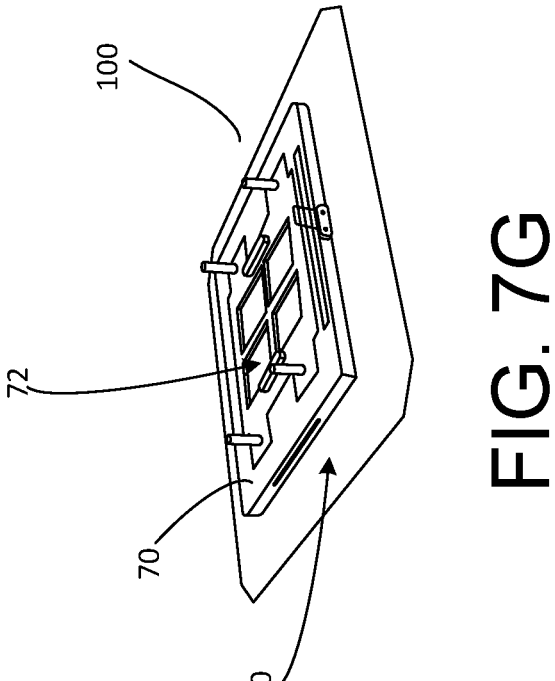
Figure 7F:
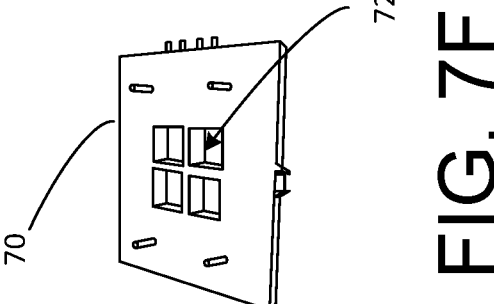

As illustrated in FIGS. 7A through 7C, the socket assembly 20 together with the contactor pad 10 may form the contactor pad assembly 30. FIG. 7D illustrates an example of a load board 40. As illustrated in FIG. 7E, the contactor pad assembly 30 may be disposed on the loadboard 40 to form the loadboard assembly 50. FIG. 7F illustrates an example of a contact unit holder (CUH) 70 and FIG. 7H illustrates an example of one or more DTU 60. As illustrated in FIG. 7G, the CUH 70 may be placed on the contactor pad assembly 30 to secure the contactor pad 10 to the loadboard 40 and to align the loadboard assembly 50 for insertion into the ATE. The CUH 70 together with the contactor pad assembly 30 and the loadboard 40 may be referred to as the CUH assembly 100. The CUH 70 may engage with a handler of the ATE during docking of the loadboard 40 with the ATE.

As illustrated in FIG. 7F, an aperture 72 may be formed on the CUH 70 to receive and position each DUT 60 within the socket assembly 20 so that each of the DUT contact pads may be in alignment with the corresponding test contact. In some examples, the CUH 70 may be secured to the loadboard 40.

During automated testing, a DUT 60 may be inserted into the aperture 72 of the CUH 70 that is configured to receive and position each DUT 60 within the socket assembly 20. In some examples, the CUH assembly 100 may be docked, i.e., attached to or inserted, into the ATE for testing. In some examples, the CUH assembly 100 may be plunged into a handler of the ATE. In some examples, the clearance between the loadboard assembly 50 and the CUH 70 when the one or more socket assembly 20 are directly installed on the loadboard 40 may not be affected by the installation of the contactor pad 10 on the loadboard 40. Thus, there may not be be any interference in the ATE based on the stack height of the contactor pad 10 and the one or more socket assembly 20.

In some examples, the contactor pad 10 ensures uniform usage of the one or more socket assembly 20 that are disposed in the openings 12 formed in the contactor pad 10. In some examples, the one or more socket assembly 20 that are disposed on the contactor pad 10 may be tracked by a single identifier of the contactor pad 10, instead of tracking multiple separate identifiers of socket assemblies 20 that are disposed on the loadboard 40. In addition, having to track a single identifier ensures more convenient maintenance of the socket assembly 20 that are removably attached to the contactor pad 10. For example, having to track a single identifier for the one or more socket assembly 20 installed on the contactor pad 10 ensures that all socket assembly 20 are serviced in a uniform manner because all the sockets may have been installed in the contactor pad 10 at the same time and may be serviced simultaneously. Tracking a single identifier also ensures more convenient and assured tracking of the tool life of the socket assembly 20.

The down time for replacing and/or maintaining each individual socket assembly 20 individually may contribute significantly to the upkeep and maintenance of the ATE. Downtime for the ATE accumulates when each socket assembly 20 needs to be repaired or maintained individually on its own separate schedule. The down time may be reduced since all the socket assemblies 20 on the contactor pad 10 may be maintained and/or serviced at one time.

Thus, the device and methods described herein provides improved control and efficiencies on assembly and maintenance of the socket assembly 20, which maximizes socket pins life expectancy.

Figure 8:
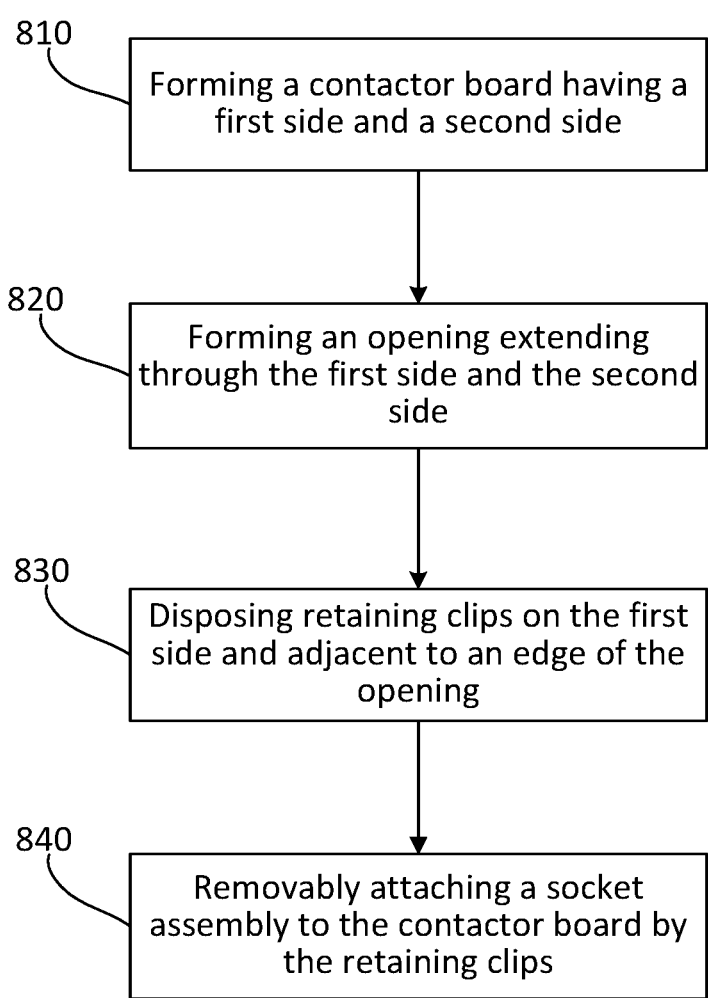
FIG. 8 is a flowchart illustrating an example of a method of manufacturing a contactor pad assembly.

FIG. 8 is a diagram illustrating an example of a method 800 of manufacturing a contactor pad assembly. Although FIG. 8 illustrates an example of operations in sequential order, it will be appreciated that this is merely an example, and that additional or alternative operations may be included. Further, the operations of FIG. 8 and related operations may be executed in a different order than that shown, or in a parallel or overlapping fashion. Descriptions of many of the operations of FIGS. 1A through 7M are applicable to similar operations of FIG. 8, thus these descriptions of FIGS. 1A through 7M are incorporated herein by reference. These descriptions may not be repeated for brevity.

In operation 810, a contactor pad 10 is formed having a first side 11 and a second side 13. Further details regarding the forming of the contactor pad 10 is described above with reference to FIGS. 3A through 6M. In operation 820, an opening 12 is formed to extend through the first side 11 and the second side 13. Further details regarding the forming of the opening 12 is described above with reference to FIGS. 3A through 6M, and are incorporated herein by reference. In operation 830, retaining members 14 are disposed on the first side 11 and adjacent to an edge of the opening. Further details regarding the retaining members 14 is described above with reference to FIGS. 3A through 6M, and are incorporated herein by reference. In operation 840, a socket assembly 20 is removably attached to the contactor pad 10 by the retaining members 14. Further details regarding the attaching of the socket assembly 20 to the contactor pad 10 by the retaining members 12 is described above with reference to FIGS. 3A through 7A.

In some examples, the method may include removably attaching the socket assembly 20 to the contactor pad 10 by the retaining members 14. In some examples, the method may include disposing screws 16 on the second side 13 to secure the retaining members 14 in a position. In some examples, the method may include forming a seal 17 along a periphery of the second side 13, the seal 17 being configured to seal a connection between the contactor pad assembly 10 and a loadboard 40. In some examples, the opening 12 may be rectangular in shape and the retaining members 14 may be disposed along longer sides of the rectangular opening.

This disclosure, its aspects, and implementations, are not limited to the specific components, assembly procedures or method elements disclosed herein. Many additional components, assembly procedures and/or method elements known in the art consistent with the intended socket assembly and the contactor pad and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such socket assembly and the contactor pad and related methods, and implementing components and methods, consistent with the intended operation and methods.

It will be understood that, in the foregoing description, when an element is referred to as being on, connected to, electrically connected to, coupled to, or electrically coupled to another element, it may be directly on, connected or coupled to the other element, or one or more intervening elements may be present. When an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Some implementations may be implemented using various semiconductor processing and/or packaging techniques.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A contactor pad assembly comprising:

a contactor pad having a first side and a second side;

an opening extending through the contactor pad from the first side to the second side, the opening being configured to receive at least a portion of a socket assembly associated with automated test equipment (ATE) for a semiconductor device;

retaining members disposed on the first side and adjacent to respective edges of the opening, the retaining members being configured to removably secure the socket assembly in the opening; and securing mechanisms disposed on the second side, the securing mechanisms being configured to secure the retaining members in a position.

2. The contactor pad assembly of claim 1, wherein the opening is rectangular in shape and the retaining members are disposed along longer sides of the rectangular opening.

3. The contactor pad assembly of claim 2, further comprising second openings extending from shorter sides of the rectangular opening, and a length of the second openings being less than a length of the shorter sides.

4. The contactor pad assembly of claim 1, further comprising the socket assembly being removably attached to the contactor pad by the retaining members.

5. The contactor pad assembly of claim 4, wherein a protrusion of the respective retaining members is inserted into respective engagement features formed on an outer surface of the socket assembly.

6. The contactor pad assembly of claim 1, wherein the securing mechanisms are tamper-proof and are operated by a socket configured to mate with a head of the securing mechanisms.

7. The contactor pad assembly of claim 1, wherein the socket assembly includes:
an alignment plate configured to retain the semiconductor device for testing in the ATE;
a socket body removably attached to the contactor pad by the retaining members; and
a pin housing including pins configured to extend out of openings formed on a first surface of the pin housing.

8. The contactor pad assembly of claim 7, wherein the socket body includes:
a chamber connecting an upper horizontal surface to a lower horizontal surface of the socket body;
a ledge formed along inner walls of the chamber, and the ledge dividing the chamber to form an upper chamber and a lower chamber;
the alignment plate being disposed in the upper chamber; and
the pin housing being disposed in the lower chamber.

9. The contactor pad assembly of claim 8, wherein the alignment plate is disposed on the first side of the contactor pad and the pin housing is disposed on the second side of the contactor pad.

10. The contactor pad assembly of claim 7, wherein the alignment plate includes an aperture configured to expose contact pads of the semiconductor device for testing in the ATE.

11. The contactor pad assembly of claim 10, wherein the pin housing includes a compartment to store the pins configured to contact the contact pads of the semiconductor device.

12. The contactor pad assembly of claim 10, wherein an arrangement of the opening of the pin housing corresponds to an arrangement of the contact pads of the semiconductor device.

13. The contactor pad assembly of claim 1, further comprising a seal disposed along a periphery of the second side, the seal being configured to seal a connection between the contactor pad assembly and a loadboard.

14. The contactor pad assembly of claim 13, wherein the seal comprises a Silicon rubber seal.

15. A method of manufacturing a contactor pad assembly, the method comprising:
forming a contactor pad having a first side and a second side;
forming an opening extending through the contactor pad from the first side to the second side, the opening being configured to receive a socket assembly associated with automated test equipment (ATE) for a semiconductor device;
disposing retaining members on the first side and adjacent to respective edges of the opening, the retaining members being configured to removably secure the socket assembly in the opening; and
disposing securing mechanisms on the second side to secure the retaining members in a fixed position.

16. The method of manufacturing of claim 15, wherein the opening is rectangular in shape and the retaining members are disposed along longer sides of the rectangular opening.

17. The method of manufacturing of claim 15, further comprising removably attaching the socket assembly to the contactor pad by the retaining members.

18. The method of manufacturing of claim 15, further comprising forming a seal along a periphery of the second side, the seal being configured to seal a connection between the contactor pad assembly and a loadboard.

19. A contactor pad assembly comprising:
a contactor pad having a first side and a second side;
a rectangular opening extending through the contactor pad from the first side to the second side, the rectangular opening being configured to receive at least a portion of a socket assembly associated with automated test equipment (ATE) for a semiconductor device;
retaining members disposed on the first side and adjacent to longer sides of the rectangular opening, the retaining members being configured to removably secure the socket assembly in the rectangular opening; and
second openings extending from shorter sides of the rectangular opening, a length of the second openings being less than a length of the shorter sides.

* * * * *